United States Patent
Cao et al.

(10) Patent No.: US 12,185,500 B2
(45) Date of Patent: Dec. 31, 2024

(54) GRAPHENE THERMALLY CONDUCTIVE GASKET EDGE-WRAPPED PROCESS AND EDGE-WRAPPED GRAPHENE THERMALLY CONDUCTIVE GASKET

(71) Applicant: SHENZHEN HFC CO., LTD., Guangdong (CN)

(72) Inventors: Yong Cao, Guangdong (CN); Aixiang Sun, Guangdong (CN); Shangqiang Yang, Guangdong (CN); Xichang He, Guangdong (CN); Lanyue Dou, Guangdong (CN); Xiaoyan Zhou, Guangdong (CN)

(73) Assignee: SHENZHEN HFC CO., LTD., Shenzhen (CN)

( * ) Notice: Subject to any disclaimer, the term of this patent is extended or adjusted under 35 U.S.C. 154(b) by 372 days.

(21) Appl. No.: 17/580,635

(22) Filed: Jan. 20, 2022

(65) Prior Publication Data

US 2023/0078935 A1    Mar. 16, 2023

(30) Foreign Application Priority Data

Sep. 13, 2021 (CN) .......................... 202111067334.7

(51) Int. Cl.
| | |
|---|---|
| B32B 9/00 | (2006.01) |
| C09J 5/06 | (2006.01) |
| F16J 15/02 | (2006.01) |
| H05K 7/20 | (2006.01) |

(52) U.S. Cl.
CPC .............. *H05K 7/2039* (2013.01); *C09J 5/06* (2013.01); *F16J 15/022* (2013.01); *Y10T 428/30* (2015.01)

(58) Field of Classification Search
CPC ..... Y10T 428/30; H05K 7/2039; F16J 15/022
USPC ......................................................... 428/408
See application file for complete search history.

(56) References Cited

U.S. PATENT DOCUMENTS

2005/0079304 A1* 4/2005 Clovesko .............. B32B 43/006
428/40.1

FOREIGN PATENT DOCUMENTS

| CN | 102122707 A | | 7/2011 |
|---|---|---|---|
| CN | 106497523 A | | 3/2017 |
| CN | 206562400 | * | 10/2017 |
| CN | 106281206 B | * | 5/2020 |
| CN | 112087914 A | | 12/2020 |

* cited by examiner

*Primary Examiner* — Daniel H Miller

(57) ABSTRACT

The present application relates to the field of electronic product heat dissipation component and in particular, relates to a graphene thermally conductive gasket edge-wrapped process and an edge-wrapped graphene thermally conductive gasket. The process steps are: coating a layer of adhesive on the first layer of graphene film, placing the second layer of graphene film on the first layer of graphene film, repeating stacking to the target height, obtaining a graphene film block, punching a plurality of through holes penetrating two surfaces of the graphene film block; threading the carbon fiber through the through holes after coating an adhesive on the surface thereof; slicing along the direction parallel to the thickness direction of the graphene film, to obtain the graphene thermally conductive gasket with a specified thickness; and coating a layer of glue on the peripheral sides of the graphene thermally conductive gasket to form an edge-wrapped layer.

11 Claims, 1 Drawing Sheet

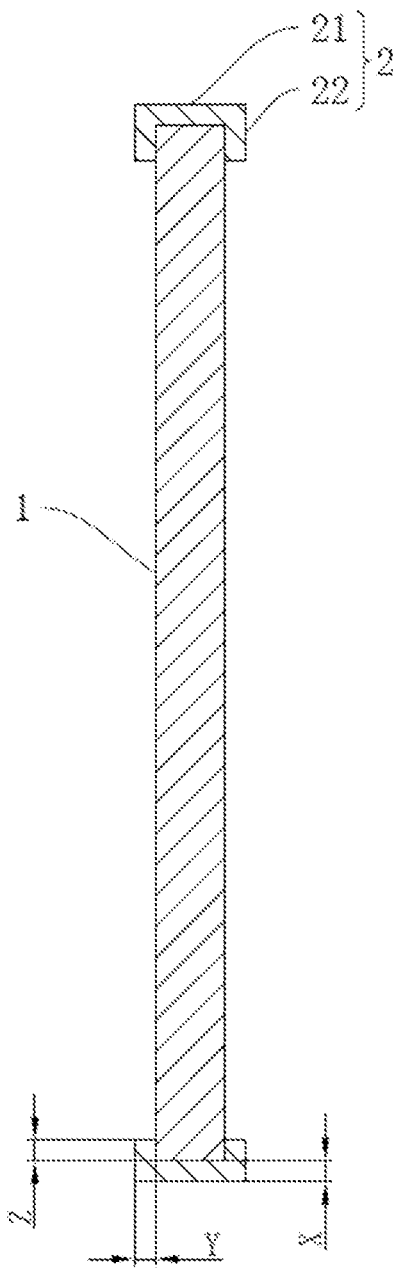

GRAPHENE THERMALLY CONDUCTIVE GASKET EDGE-WRAPPED PROCESS AND EDGE-WRAPPED GRAPHENE THERMALLY CONDUCTIVE GASKET

CROSS-REFERENCE TO RELATED APPLICATION

This application is based on and claims the priority to Chinese patent application serial no. 202111067334.7, filed on Sep. 13, 2021. The entirety of the above-mentioned patent application is hereby incorporated by reference herein and made a part of this specification.

TECHNICAL FIELD

The present application relates to the field of electronic product heat dissipation component and in particular, relates to a graphene thermally conductive gasket edge-wrapped process and an edge-wrapped graphene thermally conductive gasket.

BACKGROUND ART

With the advent of 5G, the operation frequency of the electronic chip is continuously increasing, the electronic product is gradually developed in the direction of light weight and highly integration, which leads to a significant increase of the device heat generation. If the generated heat cannot be conducted out in time, the operation state of the electronic device may be extremely affected, which causes the shortening of the service life and even failure of the device when serious, so as to cause a serious quality problem. In order to solve the heat dissipation problem of the electronic product, thermal interface material emerges at the times required.

The thermal interface material is a general term of the material coated between the heat dissipation component and the heat generation component to reduce the contacting thermal resistance therebetween. Traditional thermal interface material mainly includes graphite film, graphene film, silicone grease, silica gel, phase change metal sheet, thermally conductive adhesive, acrylic resin and so like. A thermally conductive gasket as an application form of the thermal interface material is favored in the selection of the thermally conductive material of the electronic device due to the properties of high compressibility, softness and elasticity, which can provide multiple selections of the thicknesses and dimensions. Graphene as a thermal interface material with excellent thermal conductivity is one of the ideal materials for thermally conductive gasket preparation.

The thermally conductive gasket using the graphene film as base material mostly adopts the process of stacking and slicing. During the process of slicing the graphene thermally conductive gasket, there may be a powder dropping phenomenon on the sides due to the slicing damage. This kind of powder has a good electric conductivity, if the powder is dropped on the circuit board, it is easy to cause a short circuit and result in a damage of the electronic product.

SUMMARY

In order to solve the powder dropping problem on the sides of the thermally conductive gasket prepared with graphene as base material, the present application provides a graphene thermally conductive gasket edge-wrapped process and an edge-wrapped graphene thermally conductive gasket.

In the first aspect, a graphene thermally conductive gasket edge-wrapped process provided in the present application adopts the following technical solution:

A graphene thermally conductive gasket edge-wrapped process includes: coating a layer of glue on a periphery of a sliced graphene thermally conductive gasket, so as to obtain an edge-wrapped graphene thermally conductive gasket, in which the glue is cured to form an edge-wrapped layer.

The edge-wrapped layer includes an edge-wrapped portion adhered on peripheral sides of the graphene thermally conductive gasket and an extensional portion extending from the edge-wrapped portion to upper and lower surfaces of the graphene thermally conductive gasket. The thickness of the edge-wrapped portion is 20-200 μm, the thickness of the extensional portion is 20-100 μm and the extension width of the extensional portion is 50-500 μm.

With the above technical solution, a layer of glue is coated on the periphery of the sliced graphene thermally conductive gasket. The glue wraps the sides of the graphene thermally conductive gasket, so as to isolate the portion of the graphene thermally conductive gasket damaged by slicing from the outside environment via glue, further to avoid the short circuit of the electronic device due to the powder dropping on the sides of the graphene thermally conductive gasket. When coating the glue, the glue is extended to the upper and lower surfaces of the graphene thermally conductive gasket, so as to improve the adhesive property between the glue and the graphene thermally conductive gasket and improve the stability of the edge-wrapped layer.

The thickness of the edge-wrapped portion, the thickness of the extensional portion and the extension width of the extensional portion may not only influence the edge-wrapped effect of the edge-wrapped layer, but also finally affect the thermal conductivity and the mechanical properties of the graphene thermally conductive gasket. When the thickness of the edge-wrapped portion is less than 20 the glue coated on the sides of the graphene thermally conductive gasket is too thin to wrap the sides completely, which still has a risk of powder dropping. When the thickness of the edge-wrapped portion is more than 200 the glue coated on the sides of the graphene thermally conductive gasket is too thick, which influences the thermal conductivity of the graphene thermally conductive gasket. When the thickness of the extensional portion is less than 20 μm and/or the extension width of the extensional portion is less than 50 the extending area of the glue to the upper and lower surfaces of the graphene thermally conductive gasket is too small, the adhesive force is relatively small and unstable. When the thickness of the extensional portion is more than 100 μm and/or the extension width of the extensional portion is more than 500 the extending area of the glue to the upper and lower surfaces of the graphene thermally conductive gasket is too large, which reduces the thermal conductivity of the graphene thermally conductive gasket.

In some embodiments, a viscosity of the glue is 50-1500 mPa·s.

With the above technical solution, the viscosity on the one hand may influence the coating of the glue, on the other hand, it may influence the properties of the edge-wrapped layer after the glue curing. Specifically, when the viscosity of the glue is less than 50 mPa·s, the viscosity is too small, which results in an insufficient adhesion during coating the glue and a poor adhesion on graphene thermally conductive gasket, so as to cause an unstable adhesion of the glue on the sides of the graphene thermally conductive gasket. In addition, a relatively high fluidity of the glue causes a too wide extension width of the extensional portion, and the thickness and the width of the edge-wrapped layer is hard to control. When the viscosity of the glue is more than 1500 mPa·s, the difficulty of glue coating is increased, the ductility of the glue is poor during coating, so as to cause a large thickness of the glue at a single position, the glue has a poor ductility extensibility on the upper and lower sides of graphene thermally conductive gasket, and the adhesive force of the glue on the surface of the graphene thermally conductive gasket gets worse.

In some embodiments, the glue is cured by room-temperature curing, thermal curing or UV curing.

With the above technical solution, the specific curing method is selected according to the type of the selected glue and the specific production environment requirements. Specifically, the thermal curing and the UV curing have fast curing speeds, but an additional curing device is required, which causes a high cost. The room temperature curing has a low cost but a slow curing speed, which influences the production efficiency. Specifically, the different curing methods can be selected according to the production requirements.

In some embodiments, the glue is made of silicone rubber, acrylic resin, epoxy resin or polyurethane.

With the above technical solution, the specific type of the glue can be selected according to the production requirements. Silicone rubber, acrylic resin, epoxy resin or polyurethane are used to reach a good adhesion effect between the edge-wrapped layer and the graphene thermally conductive gasket, which leads to not only a good edge-wrapped performance, but also an excellent mechanical property.

In some embodiments, the glue is coated by dispensing, dipping or rolling, preferably the dispensing.

With the above technical solution, since the entire thickness of graphene thermally conductive gasket is relatively thin, the width of the glue to be coated on the sides thereof is limited, a more precise method is needed for the glue coating. The sides of graphene thermally conductive gasket can be coated with the glue of appropriate thickness by using a precision dispenser to conduct the dispensing, the dipping or the rolling, in which the dispensing is preferred. The precision dispenser can easily control the dispensing amount of the glue and ensure the dimension of the edge-wrapped layer.

In some embodiments, the graphene thermally conductive gasket is prepared by the following method:

stacking the graphene films; coating a layer of adhesive on a first layer of graphene film, placing a second layer of graphene film on the first layer of graphene film, and coating a layer of adhesive on the second layer of graphene film, repeating stacking until the target height is reached, to obtain a graphene film block after the adhesive is cured;

punching; punching a plurality of through holes penetrating the upper and lower surfaces of the graphene film block on the graphene film block, in which the axial direction of the through holes is parallel to the stacking direction of the graphene film, and the through holes are in an array distribution on the graphene film block;

threading a carbon fiber through the holes; coating an adhesive on the surface of the rewinding carbon fiber, threading the carbon fiber through the through holes, to obtain a graphene-carbon fiber three-dimensional structure;

slicing: slicing the obtained graphene-carbon fiber three-dimensional structure along the direction parallel to the stacking direction of the graphene film, to obtain the graphene thermally conductive gasket with a specified thickness; and edging: coating a layer of glue on a periphery of a sliced graphene thermally conductive gasket, in which the glue is cured to form an edge-wrapped layer.

The thickness of the graphene film is preferably 200-700 μm, further preferably 500 μm. The size of graphene film is preferably 10*10-200*200 mm, and the stacking height of graphene film is preferably 10-200 mm.

The adhesive is preferably made of silicone rubber, acrylic resin, epoxy resin or polyurethane, and further preferably silicone rubber or acrylic resin. The thickness of the adhesive coating between the graphene films is preferably 10-100 μm, further preferably 20-50 μm.

The aperture of the through hole provided on the graphene block is preferably 20-100 μm, further preferably 40-80 μm. The spacing between the centers of two adjacent through holes is preferably 50-200 μm, further preferably 80-150 μm.

The carbon fiber is preferably made of polyacrylonitrile based carbon fiber, asphalt based carbon fiber or viscose based carbon fiber, and the diameter of the carbon fiber is preferably 5-15 μm, further preferably 7-10 μm, and further preferably 7 μm.

With the above technical solution, the present application integrates the carbon fiber into the graphene thermally conductive gasket by means of stacking, punching, slicing and cutting, which improves the thermal conductivity performance in the stacking interlayer direction of graphene film through the carbon fiber. By the cooperation of graphene film and carbon fiber, the final graphene thermally conductive gasket not only has a high thermal conductivity and a low thermal resistance in the interlayer direction of graphene film, but also has an excellent heat dissipation effect in the interlayer direction.

In the second aspect, the present application provides an edge-wrapped graphene thermally conductive gasket prepared by the above preparation process.

In some embodiments, the thickness of the edge-wrapped graphene thermally conductive gasket is 0.1-5 mm.

In conclusion, the present application has the following beneficial effects: the precision dispenser is adopted in the present application to coat a layer of glue on peripheral sides in the thickness direction of the graphene thermally conductive gasket, the glue is cured to form an edge-wrapped layer. By wrapping the sides of the graphene thermally conductive gasket by the edge-wrapped layer, the powder dropping problem on the sides of the graphene thermally conductive gasket can be effectively solved, which furtherly reduces the risk of short circuit damage of electronic devices caused by graphene debris falling on the circuit board, and increases the stability and service life of graphene thermally conductive gasket in the field of the heat dissipation of the electronic devices. In addition, the thermal conductivity and mechanical properties of graphene thermally conductive gasket remain at a better level after coating the edge-wrapped layer.

BRIEF DESCRIPTION OF THE DRAWINGS

The sole FIGURE is a cross-sectional diagram of the edge-wrapped graphene thermally conductive gasket along the thickness direction in the present application.

DETAILED DESCRIPTION

The present application is further described in detail below in combination with the sole FIGURE, preparation examples and embodiments.

Preparation Example

The graphene thermally conductive gasket is prepared by the following method:

a first layer graphene film was placed on the operation table smoothly, a layer of adhesive was coated on the first layer of graphene film, the second layer of graphene film was placed on the first layer of graphene film, a layer of adhesive was coated on the second layer of graphene film, stacking was repeated until the target height was reached, to obtain a graphene film block after the adhesive was cured.

A plurality of through holes were punched on the obtained graphene film block, in which the axial direction of the through holes is along the stacking direction of the graphene film, the through holes penetrate two sides of the graphene film block, and the through holes are in an array distribution on the graphene film block.

The carbon fiber was dipped in an adhesive, the carbon fiber was threaded through the through holes, the entire through hole was filled with carbon fiber along the length direction, to obtain a graphene-carbon fiber three-dimensional structure.

The obtained graphene-carbon fiber three-dimensional structure was sliced along the stacking direction of the graphene films, to obtain a large graphene thermally conductive gasket, in which the carbon fibers are evenly distributed in the graphene thermally conductive gasket.

The large graphene thermally conductive gasket obtained by slicing was cut into graphene thermally conductive gasket with specified dimension.

The size of graphene film was 50*50 mm, the thickness was 500 μm, and the stacking height of graphene film was 50 mm.

The adhesive was acrylic resin adhesive, the coating method of the adhesive was spraying, the thickness was 30 μm, and the curing method was the thermal curing.

The aperture of the through hole was 60 μm, the spacing between the centers of two adjacent through holes was 120 μm, and the punching method of the through holes was the laser punching.

The carbon fiber was made of polyacrylonitrile based carbon fiber, and the diameter was 7 μm.

The slicing thickness of the graphene thermally conductive gasket was 2 mm.

EMBODIMENTS

Embodiments 1-8

Embodiments 1-8 disclose an edge-wrapped graphene thermally conductive gasket, which adopts the following preparation process:

evenly coating a layer of glue on peripheral sides in the thickness direction of the graphene thermally conductive gasket obtained by the preparation example by using a precision dispenser to form an edge-wrapped layer, in which the portion of the glue adhered on the peripheral sides of the graphene thermally conductive gasket was cured to form the edge-wrapped portion, and a portion extends from the edge-wrapped portion to adhere on the upper and lower sides of the graphene thermally conductive gasket to form the extensional portion after curing.

The glue was silicone rubber, the glue coating method was dispensing with high-precision dispenser, and the glue curing method was thermal curing. The viscosity of the glue and the dimension parameters of each portion after the curing of the edge-wrapped layer was shown in Table 1. In Table 1, "the thickness of the edge-wrapped portion" was marked as X in the sole FIGURE, "the thickness of the extensional portion" was marked as Y in the sole FIGURE, and "the width of the extensional portion" was marked as Z in the sole FIGURE.

TABLE 1 the dimension parameters of each portion of the edge-wrapped layer and the viscosity of the glue

| | Edge-wrapped portion thickness (μm) | Extensional portion thickness (μm) | Edge-wrapped portion width (μm) | Glue viscosity (mPa · s) |
|---|---|---|---|---|
| Embodiment 1 | 20 | 20 | 50 | 50 |
| Embodiment 2 | 200 | 20 | 50 | 50 |
| Embodiment 3 | 120 | 20 | 50 | 50 |
| Embodiment 4 | 120 | 100 | 500 | 50 |
| Embodiment 5 | 120 | 40 | 300 | 50 |
| Embodiment 6 | 120 | 80 | 100 | 50 |
| Embodiment 7 | 120 | 80 | 100 | 1500 |
| Embodiment 8 | 120 | 80 | 100 | 1000 |

Embodiment 9

This embodiment discloses an edge-wrapped graphene thermally conductive gasket. The preparation process was as follows: a layer of glue was coated around the graphene thermally conductive gasket obtained in preparation example 1, the glue was silicone rubber, the glue viscosity was 10 mPa·s, and the glue curing method was thermal curing.

Embodiment 10

This embodiment differs from Embodiment 9 in that the glue viscosity was 2000 mPa·s.

Embodiment 11

This embodiment differs from Embodiment 8 in that the glue was acrylic resin glue with a viscosity of 1000 mPa·s.

Embodiment 12

This embodiment differs from Embodiment 8 in that the graphene thermally conductive gasket in this embodiment was prepared by the following method:

a first layer graphene film was placed on the operation table smoothly, a layer of adhesive was coated on the first layer of graphene film, the second layer of graphene film was placed on the first layer of graphene film, a layer of adhesive was coated on the second layer of graphene film, stacking was repeated until the target height was reached, to obtain a graphene film block.

The graphene film block was sliced along the stacking direction of the graphene films, to obtain a large graphene thermally conductive gasket.

The large graphene thermally conductive gasket obtained by slicing was cut into graphene thermally conductive gasket with specified dimension.

The adhesive was acrylic resin adhesive, the coating method of the adhesive was spraying, the thickness was 30 μm, and the curing method was the thermal curing. The slicing thickness of the graphene thermally conductive gasket was 2 mm.

COMPARATIVE EXAMPLE

Comparative Example 1

This comparative example differs from Embodiment 8 in that the sides of the graphene thermally conductive gasket were not coated by glue after cutting, that is, there was no edge-wrapped layer on the sides of the graphene thermally conductive gasket.

Comparative Example 2

This comparative example differs from Embodiment 8 in that the thickness of the edge-wrapped portion was 250 μm, the thickness of the extensional portion was 150 μm and the extension width of the extensional portion was 800 μm.

Comparative Example 3

This comparative example differs from Embodiment 8 in that the thickness of the edge-wrapped portion was 10 μm, the thickness of the extensional portion was 60 μm and the extension width of the extensional portion was 150 μm.

Comparative Example 4

This comparative example differs from Embodiment 8 in that the thickness of the edge-wrapped portion was 100 μm, the thickness of the extensional portion was 10 μm and the extension width of the extensional portion was 20 μm.

Performance Test

In each embodiment and comparative example, a graphene thermally conductive gasket with a thickness of 2 mm was selected for performance testing. The tensile strength of graphene thermally conductive gasket was tested according to ASTM D412-2006, the compression rebound rate of the thermally conductive gasket was tested according ASTM D575-1991, and the thermal conductivity of the thermally conductive gasket was tested according to ASTM D5470. The powder dropping rate of graphene thermally conductive gasket was tested by vibration to test the improvement effect of edge-wrapped layer on powder dropping of graphene thermally conductive gasket.

Random vibration was adopted for vibration test, in which the vibration frequency range was 5-500 Hz and the vibration amount was 2.2 g. The directions of vibration test were X-Y-Z three-axis directions and time of vibration test was 10 min in each direction. After the vibration test, it is observed whether there was debris on the transparent double-sided adhesive tape on the fixture below the graphene thermally conductive gasket. When there was debris, the powder dropping rate was calculated by weighing the weight change of the graphene thermally conductive gasket before and after the vibration test. The formula for calculating the powder dropping rate was: $p=100\%*(m_1-m_2)/m_1$, where p was the powder dropping rate, $m_1$ was the weight of graphene thermally conductive gasket before the vibration test, and $m_2$ was the weight of graphene thermally conductive gasket after the vibration test.

The performance test data of Embodiments 1-12 and comparative examples 1~4 were shown in Table 2 below.

TABLE 2 the performance test data of Embodiments 1-12 and comparative examples 1-4

| | Thermal conductivity (W/(m · K)) | Tensile strength (Mpa) | Rebound rate (%) | Powder dropping rate (%) |
|---|---|---|---|---|
| Embodiment 1 | 192 | 0.21 | 79 | 0 |
| Embodiment 2 | 177 | 0.25 | 85 | 0 |
| Embodiment 3 | 187 | 0.26 | 81 | 0 |
| Embodiment 4 | 161 | 0.36 | 92 | 0 |
| Embodiment 5 | 171 | 0.3 | 89 | 0 |
| Embodiment 6 | 182 | 0.28 | 88 | 0 |
| Embodiment 7 | 181 | 0.29 | 87 | 0 |
| Embodiment 8 | 183 | 0.33 | 91 | 0 |
| Embodiment 9 | 181 | 0.28 | 83 | 0.03 |
| Embodiment 10 | 180 | 0.27 | 81 | 0 |
| Embodiment 11 | 184 | 0.32 | 89 | 0 |
| Embodiment 12 | 165 | 0.22 | 75 | 0 |
| Comparative example 1 | 195 | 0.29 | 85 | 0.05 |
| Comparative example 2 | 165 | 0.35 | 94 | 0 |
| Comparative example 3 | 185 | 0.29 | 84 | 0.02 |
| Comparative example 4 | 187 | 0.27 | 83 | 0 |

In combination with Embodiment 8, Comparative example 1 and the data in Table 2, the problem of powder falling on the sides of graphene thermally conductive gasket can be effectively solved after coating the glue around graphene thermally conductive gasket to form an edge-wrapped layer.

In combination with Embodiments 1-3, Comparative examples 1-3 and the data in Table 2, after the edge-wrapped layer is formed in the periphery of the graphene thermally conductive gasket, the phenomenon of powder dropping on the sides of the graphene thermally conductive gasket may be significantly reduced, but it can also affect the thermal conductivity and mechanical properties of the graphene thermally conductive gasket. Specifically, when the thickness of the edge-wrapped portion increases, the tensile strength and compression rebound rate of the edge-wrapped graphene thermally conductive gasket are increased, but at the same time, the thermal conductivity of the edge-wrapped graphene thermally conductive gasket may decrease, that is, the excessive thickness of the glue in the edge-wrapped portion may affect the thermal conductivity of the graphene thermally conductive gasket in the horizontal direction. In addition, according to Comparative example 3, when the thickness of the edge-wrapped portion is too thin, the glue of the edge-wrapped portion cannot completely wrap the sides of the graphene thermal conducting gasket, and a small amount of debris may fall during vibration test. When the thickness of the edge-wrapped portion is about 100 μm, the anti-powder-dropping effect, the thermal conductivity and the mechanical properties of graphene thermally conductive gasket can reach a good state.

In combination with Embodiments 4-6, Comparative example 2 and the data in Table 2, after the edge-wrapped layer is formed around the graphene thermally conductive gasket, the thickness and extension width of the extensional portion can influence the thermal conductivity and mechanical properties of the edge-wrapped graphene thermally conductive gasket. Specifically, when the thickness and extension width of the extensional portion are increased, the tensile strength and the rebound rate of the edge-wrapped graphene thermally conductive gasket is reduced, which is conducive to enhancing the mechanical properties of the edge-wrapped graphene thermally conductive gasket, but it also reduces the thermal conductivity of the edge-wrapped graphene thermally conductive gasket. During the test of the Comparative example 4, due to the small thickness and extension width of the extensional portion, the adhesion effect between the edge-wrapped layer and the graphene thermally conductive gasket is weak, and the edge-wrapped layer is easy to separate from the side of the graphene thermally conductive gasket.

In combination with Embodiments 7-10, the data in Table 2 and the preparation test process, the viscosity of the glue has a certain impact on the mechanical properties of the edge-wrapped graphene thermally conductive gasket. Specifically, when the viscosity of the glue is too small, it may lead to the weakening of the rebound rate and tensile strength of the edge-wrapped graphene thermally conductive gasket. In addition, during the test, it is found that if the viscosity of the glue is too small, the glue is not easy to adhere to the sides of the graphene thermally conductive gasket due to too large fluidity, the width and thickness of each portion of the edge-wrapped layer are not easy to control. Too little glue adhered to the sides of the graphene thermally conductive gasket cannot play a good edge-wrapped effect, and there is still the problem of powder dropping. When the viscosity of the glue is too large, it is difficult to extrude the glue during dispensing, and the dimension of each portion of the edge-wrapped layer is difficult to control.

In combination with Embodiment 8, Embodiment 11 and the data in Table 2, using acrylic resin glue as the edge-wrapped layer, there is no significant difference in the anti-powder-dropping effect and thermal conductivity of the edge-wrapped graphene thermally conductive gasket, but the mechanical properties of silicone rubber are better. Therefore, the graphene thermally conductive gasket prepared by the edge-wrapped layer with silicone rubber has better mechanical properties.

In combination with Embodiment 8, Embodiment 11 and the data in Table 2, the edge-wrapped graphene thermally conductive gasket prepared by the method for preparing graphene thermally conductive gasket provided in the present application not only has a good anti-powder-dropping effect, but also has an excellent thermal conductivity and mechanical properties.

In conclusion, coating a layer of glue on the peripheral sides around the graphene thermally conductive gasket can effectively solve the problem of powder dropping on the sides of the graphene thermally conductive gasket, and further reduce the risk of damage caused by short circuit of electronic devices caused by powder debris falling on the circuit board. In addition, providing the edge-wrapped layer around the graphene thermal conduction gasket can ensure better mechanical properties and thermal conductivity, which has a wide application prospect in the field of chip heat dissipation.

The specific embodiments are only an interpretation of the present application, which are not intend to limit the present application. After reading the specification, those skilled in the art can make modifications to the embodiment without creative contribution as required, but these modifications are protected by the patent law as long as they are within the scope of the claims of the present application.

What is claimed is:

1. A graphene thermally conductive gasket edge-wrapped process, comprising: coating a layer of glue on a periphery of a sliced graphene thermally conductive gasket, to obtain an edge-wrapped graphene thermally conductive gasket, wherein the glue is cured to form an edge-wrapped layer;
    wherein the edge-wrapped layer comprises an edge-wrapped portion adhered on peripheral sides of the graphene thermally conductive gasket and an extensional portion extending from the edge-wrapped portion to upper and lower surfaces of the graphene thermally conductive gasket, a thickness of the edge-wrapped portion is 20-200 μm, a thickness of the extensional portion is 20-100 μm and an extension width of the extensional portion is 50-500 μm;
    wherein a viscosity of the glue is 50-1500 mPa·s.

2. The graphene thermally conductive gasket edge-wrapped process according to claim 1, wherein the glue is cured by room-temperature curing, thermal curing or UV curing.

3. The graphene thermally conductive gasket edge-wrapped process according to claim 1, wherein the glue is made of silicone rubber, acrylic resin, epoxy resin or polyurethane.

4. The graphene thermally conductive gasket edge-wrapped process according to claim 1, wherein the glue is coated by dispensing, dipping or rolling.

5. The graphene thermally conductive gasket edge-wrapped process according to claim 1, wherein the graphene thermally conductive gasket is prepared by a following method:
    stacking graphene films; coating a layer of adhesive on a first layer of graphene film, placing a second layer of graphene film on the first layer of graphene film, coating a layer of adhesive on the second layer of graphene film, repeating stacking until a target height is reached, to obtain a graphene film block after the adhesive is cured;
    punching; punching a plurality of through holes penetrating the upper and lower surfaces of the graphene film block on the graphene film block, wherein the axial direction of the through holes is parallel to a stacking direction of the graphene film;
    threading a carbon fiber through the holes; coating an adhesive on a surface of the carbon fiber, and then threading the carbon fiber through the through holes, to obtain a graphene-carbon fiber three-dimensional structure;
    slicing; slicing the obtained graphene-carbon fiber three-dimensional structure along a direction parallel to the stacking direction of the graphene film, to obtain the graphene thermally conductive gasket with a specified thickness; and
    cutting; cutting the graphene thermally conductive gasket obtained by slicing into graphene thermally conductive gasket with specified dimension.

6. An edge-wrapped graphene thermally conductive gasket, wherein the edge-wrapped graphene thermally conductive gasket is prepared by the process according to claim 1.

7. The edge-wrapped graphene thermally conductive gasket according to claim 6, wherein the glue is cured by room-temperature curing, thermal curing or UV curing.

8. The edge-wrapped graphene thermally conductive gasket according to claim 6, wherein the glue is made of silicone rubber, acrylic resin, epoxy resin or polyurethane.

9. The edge-wrapped graphene thermally conductive gasket according to claim 6, wherein the glue is coated by dispensing, dipping or rolling.

10. The edge-wrapped graphene thermally conductive gasket according to claim 6, wherein the graphene thermally conductive gasket is obtained by a following method:

stacking graphene films; coating a layer of adhesive on a first layer of graphene film, placing a second layer of graphene film on the first layer of graphene film, coating a layer of adhesive on the second layer of graphene film, repeating stacking until a target height is reached, to obtain a graphene film block after the adhesive is cured;

punching; punching a plurality of through holes penetrating the upper and lower surfaces of the graphene film block on the graphene film block, wherein the axial direction of the through holes is parallel to a stacking direction of the graphene film;

threading a carbon fiber through the holes; coating an adhesive on a surface of the carbon fiber, and then threading the carbon fiber through the through holes, to obtain a graphene-carbon fiber three-dimensional structure;

slicing; slicing the obtained graphene-carbon fiber three-dimensional structure along a direction parallel to the stacking direction of the graphene film, to obtain the graphene thermally conductive gasket with a specified thickness; and cutting; cutting the graphene thermally conductive gasket obtained by slicing into graphene thermally conductive gasket with specified dimension.

11. The edge-wrapped graphene thermally conductive gasket according to claim 6, wherein the thickness of the prepared edge-wrapped graphene thermally conductive gasket is 0.1-5 mm.

* * * * *